United States Patent [19]

Kanai et al.

[11] Patent Number: 5,017,145
[45] Date of Patent: May 21, 1991

[54] MATRIX SWITCHING DEVICE AND METHOD OF MANUFACTURING THE SAME

[75] Inventors: Tsuneo Kanai, Tokorozawa; Shigefumi Hosokawa, Iruma; Yasuo Kumakura; Shigeru Umemura, both of Tokyo; Shuichiro Inagaki, Yokohama, all of Japan

[73] Assignee: Nippon Telegraph & Telephone Corporation, Tokyo, Japan

[21] Appl. No.: 342,743

[22] Filed: Apr. 24, 1989

[30] Foreign Application Priority Data

Apr. 27, 1988 [JP] Japan .................. 63-102767
Nov. 9, 1988 [JP] Japan .................. 63-283201

[51] Int. Cl.$^5$ .................. H01R 29/00; H01R 9/09
[52] U.S. Cl. .................. 439/45; 439/48; 439/75; 29/850
[58] Field of Search .................. 439/45–48, 439/53, 74, 75; 29/837, 850

[56] References Cited

U.S. PATENT DOCUMENTS

| 3,028,573 | 4/1962 | Stoehr | 439/48 |
|---|---|---|---|
| 3,065,439 | 11/1962 | Krause | 439/48 |
| 3,151,923 | 10/1964 | Bell et al. | 339/18 |
| 3,162,500 | 12/1964 | Pittman | 439/45 |
| 3,205,469 | 9/1965 | Frank et al. | 439/48 |
| 3,252,056 | 5/1966 | Poesl | 317/12 |
| 3,349,936 | 10/1967 | Cartelli | 439/48 |
| 3,546,009 | 12/1970 | Schneble et al. | 117/212 |
| 3,600,330 | 8/1971 | Schneble et al. | 252/430 |
| 4,662,963 | 5/1987 | Varker | 29/850 |

FOREIGN PATENT DOCUMENTS

| 1727662 | 10/1953 | Fed. Rep. of Germany . |
| 1133781 | 1/1958 | Fed. Rep. of Germany . |
| 1965236 | 5/1971 | Fed. Rep. of Germany . |
| 62-186594 | 8/1987 | Japan . |
| 560000 | 3/1975 | Switzerland . |
| 86/07208 | 12/1986 | World Int. Prop. O. . |

*Primary Examiner*—Paula A. Bradley
*Attorney, Agent, or Firm*—Frishauf, Holtz, Goodman & Woodward

[57] ABSTRACT

A matrix switching device includes a matrix board and a connecting pin. X-conductor patterns are arranged in parallel with each other on one surface of the matrix board, and Y-conductor patterns are arranged in parallel with each other on the other surface. Both the patterns are arranged in a matrix form. At each crossing point of the both patterns, a through hole having conductive portions respectively connected to the X- and Y-conductor patterns and an intermediate isolation portion for interrupting conduction between the conductive portions is formed in the matrix board. The connecting pin includes conductive portions respectively electrically connected to the X- and Y-conductor patterns through the conductive portions of the through hole upon insertion of the connecting pin into the through hole.

5 Claims, 12 Drawing Sheets

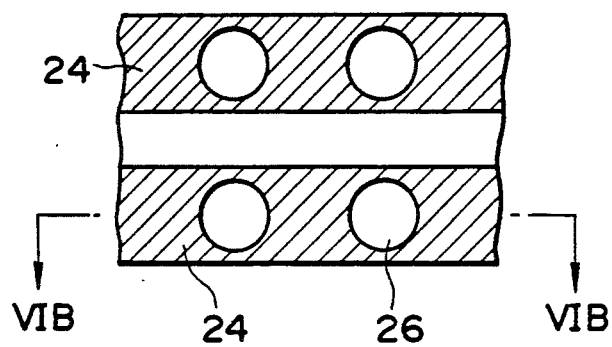
F I G. 6A
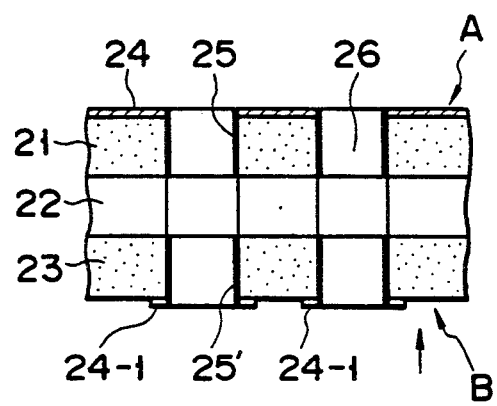
F I G. 6B
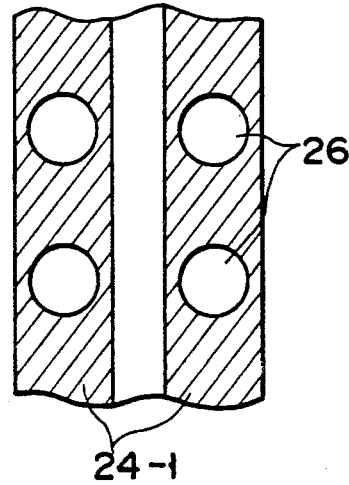
F I G. 6C

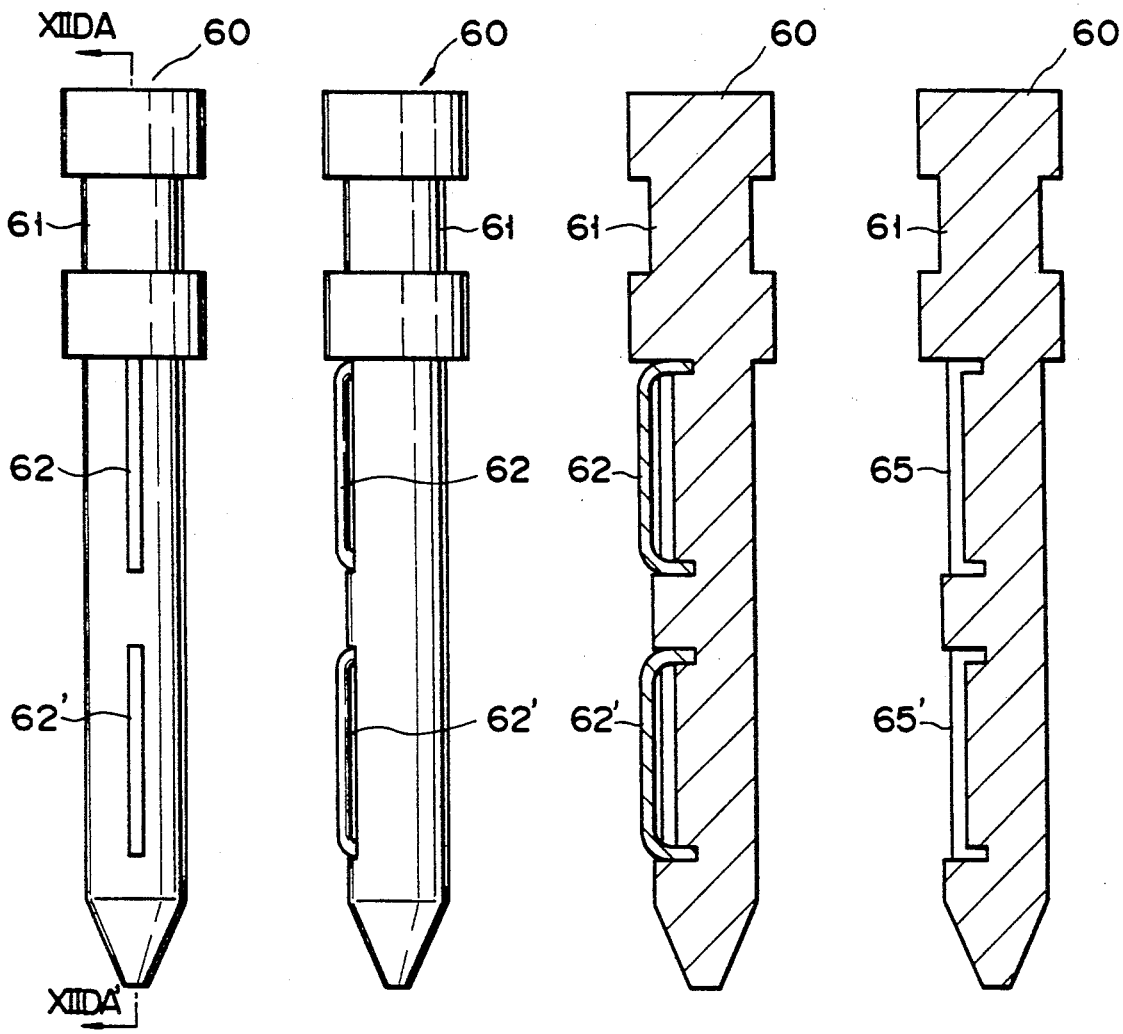
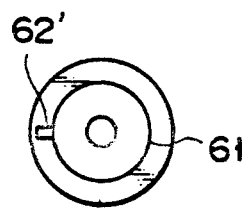
FIG. 12C
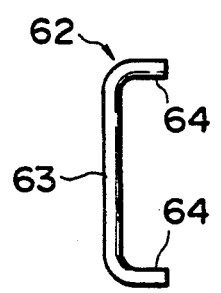
FIG. 12F
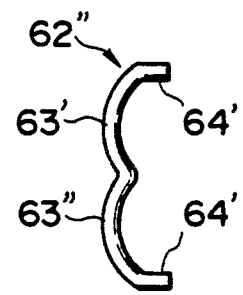
FIG. 12G

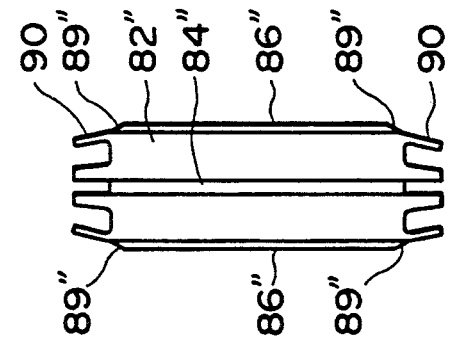
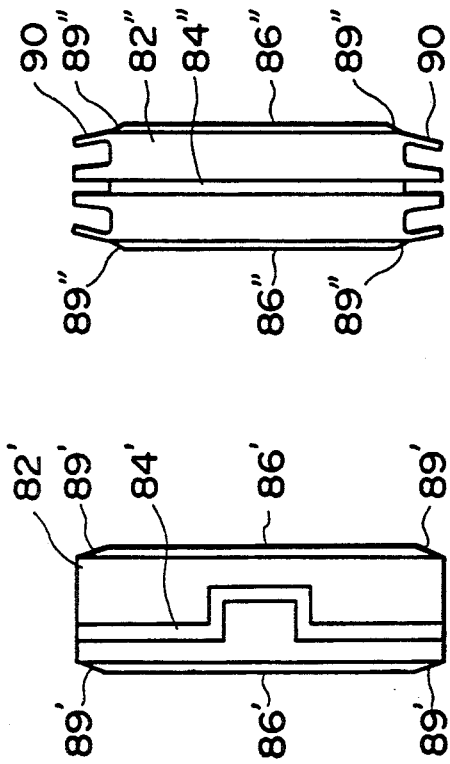
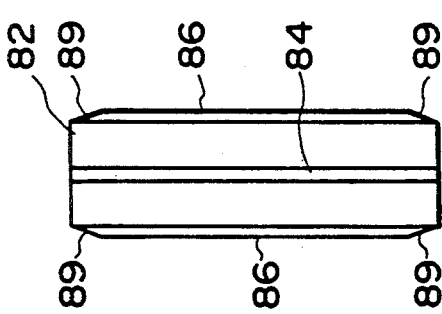
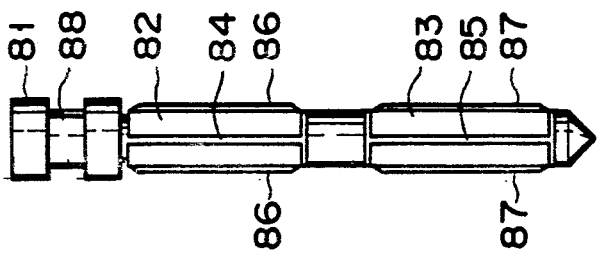
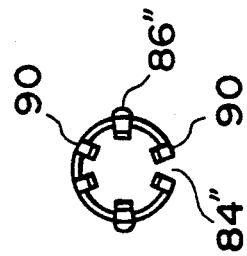
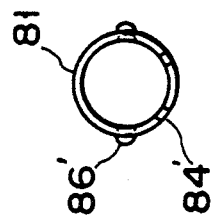
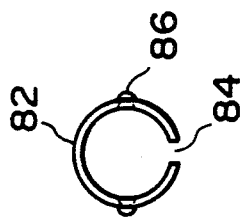

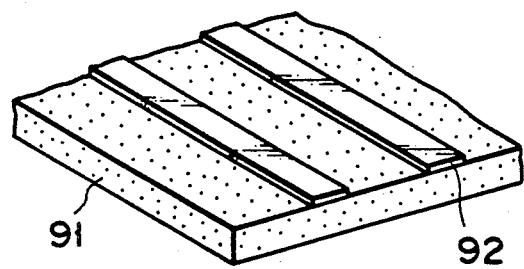
FIG. 20A
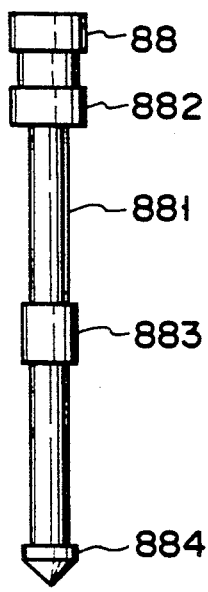
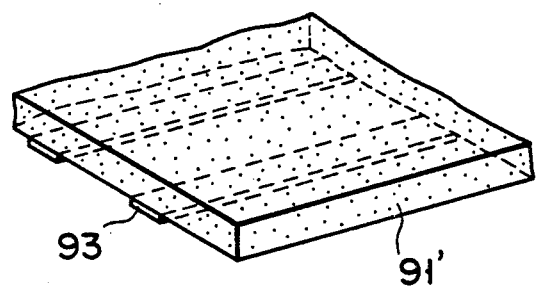
FIG. 19A    FIG. 20B
FIG. 19B
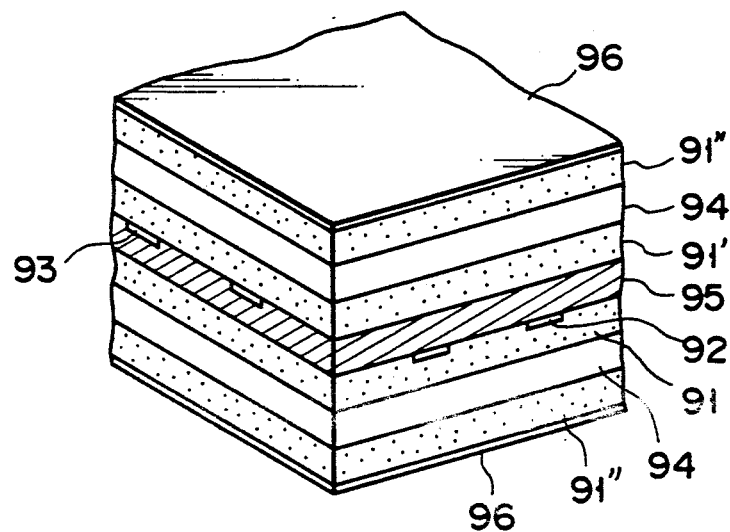
FIG. 20C

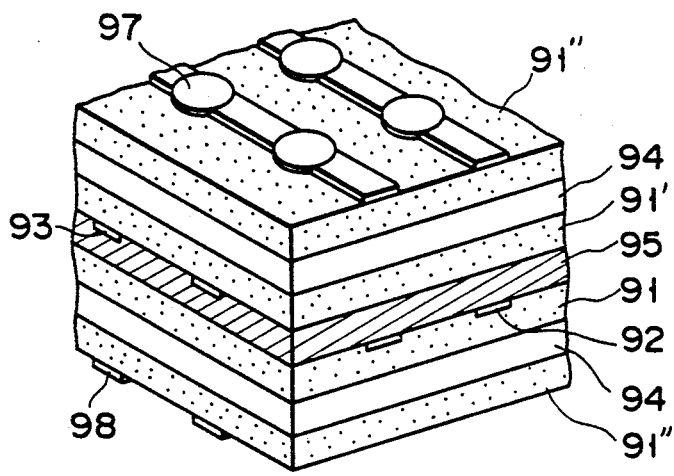
F I G. 20D
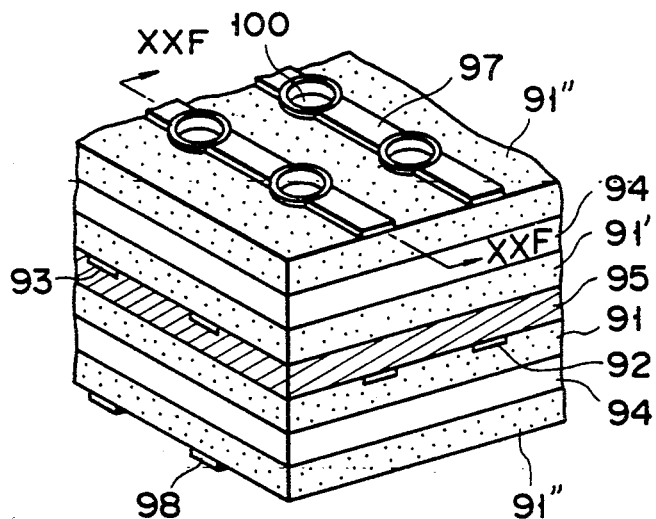
F I G. 20E
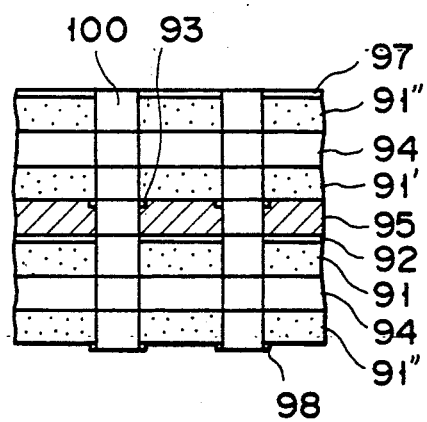
F I G. 20F
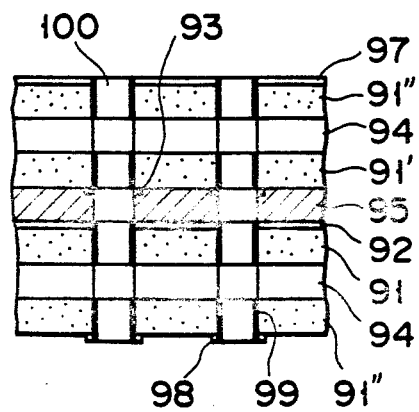
F I G. 20G

MATRIX SWITCHING DEVICE AND METHOD OF MANUFACTURING THE SAME

BACKGROUND OF THE INVENTION

1. Field of the Invention

The present invention relates to a versatile matrix switching device which is effective for practical use of an automatic MDF in a communication network, and which can be widely used for a distribution frame for transmission lines.

2. Description of the Related Art

In a communication network, a main distribution frame (MDF) is disposed as a connecting device in a telephone office to connect a telephone set to exchange equipment. However, as shown in FIG. 1, the main distribution frame includes a terminal strip group 3 connected to a telephone set 1, a terminal strip group 4 connected to exchange equipment 2, and a jumper 5 for connecting the terminal strip groups 3 and 4, and has a matrix switching function for connecting an arbitrary telephone set 1 to the exchange equipment 2 via the jumper 5 in order to perform installation, transfer, and removal of the telephone set 1.

An example of this type of the prior art is disclosed in PCT No. 62-502642. FIG. 2 is a partially cutaway perspective view of a conventional pin board matrix. Referring to FIG. 2, reference numeral 101 denotes an upper board; 102, a lower board; 103 and 104, fixed boards; and 105, each linear spring of a metal wire disposed along an X-coordinate direction (to be referred to as an X-conductor linear spring). A plurality of X-conductor linear springs 105 are respectively supported by grooves 200 of the upper board 101 at equal intervals. For example, a telephone set is connected to an extending line of the X-conductor linear spring 105. Reference numeral 106 denotes each linear spring of a metal wire disposed along a Y-coordinate direction (to be referred to as a Y-conductor linear spring). The Y-conductor linear springs 106 perpendicularly intersect with the X-conductor linear springs 105. The plurality of Y-conductor linear springs 106 are respectively supported by grooves 201 of the lower board 102 at equal intervals. For example, exchange equipment is connected to an extending line of the Y-conductor linear spring 106. Reference numerals 107, 108, and 109 denote through holes, respectively. Each through hole 107 is formed in the fixed board 103, each through hole 108 is formed in the upper board 101, and each through hole 109 is formed in the lower board 102. These through holes respectively correspond to crossing points in a longitudinal direction of the X- and Y-conductors. Note that the X- and Y-conductor linear springs 105 and 106 partially cross the through holes of the corresponding boards in a matrix form. The boards are stacked and fixed to each other. Reference numeral 110 denotes a rigid conductor pin. When each conductor pin 110 is inserted into the though holes 107, 108, and 109, the corresponding X- and Y-conductor linear springs 105 and 106 are connected to each other through the conductor pin 110. With such an arrangement, when the conductor pin 110 is inserted into the through holes 107, 108, and 109, the X- and Y-conductor linear springs 105 and 106 are deformed to be in contact with the rigid conductor pin 110, and are electrically connected to each other. As a result, an inserting position of the conductor pin 110 is properly selected, so that a matrix switch for selectively connecting arbitrary X- and Y-conductors can be arranged.

Another example of the prior art is disclosed in U.S. Pat. No. 3,151,923. FIG. 3 is a sectional view of a main part of a pin board matrix. Referring to FIG. 3, reference numeral 111 denotes an upper board 1; 112, a lower board 1; 113, an insulating board; 114, an upper board 2; 115, a lower board 2; 116, an $X_1$-conductor linear spring; 117 and 117', $Y_1$-conductor linear springs; 118, an $X_2$-conductor linear spring; 119 and 119', $Y_2$-conductor linear springs; 120, a pin; 121, an insulator; 122 and 123, conductors; and 124, a through hole in each board. Other examples of the pin board matrix shown in FIG. 3 can be basically obtained by stacking two sets of matrix boards having the structures shown in FIG. 2 through the insulating board 113. The $X_1$-conductor linear spring 116 overlaps the $Y_1$-conductor linear springs 117 and 117' perpendicularly intersecting therewith, and the $X_2$-conductor linear spring 118 overlaps the $Y_2$-conductor linear springs 119 and 119' perpendicularly intersecting therewith. In the pin 120 for connecting an $X_1$ conductor to a $Y_1$ conductor, the conductors 122 and 123 are isolated from each other through the insulator 121 in correspondence with the $X_1$ and $Y_1$ conductors and the $X_2$ and $Y_2$ conductors in the matrix board.

With such an arrangement, when the connecting pin 120 is inserted into the through holes 124 of the boards, the $X_1$-conductor linear spring 116 electrically connected to the $Y_1$-conductor linear springs 117 and 117', and the $X_2$-conductor linear spring 118 is electrically connected to the $Y_2$-conductor linear springs 119 and 119'. More specifically, a matrix switch for connecting two portions of X- and Y-conductors upon one inserting operation of the pin can be arranged.

In the conventional pin board matrix shown in FIG. 2, however, in order to achieve a stable contact state, it is necessary to uniform the contact states between the conductor pin 110 and X- and Y-conductor linear springs 105 and 106. However, with this arrangement, it is necessary to form through holes in boards for supporting the springs in advance. More specifically, when the through holes are formed after the boards are stacked, the X- and Y-conductors are damaged. Therefore, when the boards which support the conductor springs are stacked, the through holes 107, 108, and 109 in the respective boards are necessarily misaligned, and contact states of the pin and metal conductor springs are not uniform upon insertion of the pin. This tendency typically occurs as pitches between adjacent metal springs are decreased, and it is difficult to achieve a decrease in pitch, i.e., a high-density arrangement.

In the above structure, since boards which support a large number of metal springs serving as conductors are carefully stacked and fixed to each other, it is unsuitable for mass production. The above-mentioned drawback also applies to the conventional pin board matrix shown in FIG. 3.

SUMMARY OF THE INVENTION

It is an object of the present invention to provide a high-density and economical matrix switching device which is suitable for mass production and which eliminates the above-mentioned conventional drawback, and a method of manufacturing the same.

In order to achieve the above object, a matrix switching device according to the present invention comprises a matrix board including X- and Y-conductor patterns respectively corresponding to upper and lower surfaces of a printed board and arranged in a matrix form, conductive portions connected to the X- and Y-conductor patterns at crossing points thereof, and intermediate isolation portions for interrupting conduction between the conductive portions, the conductive portions and the intermediate isolation portions defining through holes formed in the matrix board; and a connecting pin having conductive portions electrically connected to corresponding ones of the X- and Y-conductor patterns through corresponding ones of the conductive portions of the matrix board upon insertion of the connecting pin into a corresponding one of the through holes.

A method of manufacturing a matrix switching device according to the present invention comprises the steps of:

forming X- and Y-conductor patterns respectively corresponding to upper and lower surfaces of a printed board in a matrix form;

forming through holes at crossing points of the X- and Y-conductor patterns;

forming an insulated and isolated portion in an intermediate inner wall portion of conductive portions of each of the through holes and respectively connecting the conductive portions to the X- and Y-conductor patterns; and preparing a connecting pin having surface-treated conductive portions brought into contact with the conductive portions formed in the inner wall portion of one of the through holes so that the X- and Y-conductor patterns are electrically connected to each other when the connecting pin is inserted into one of the through holes formed in the printed board.

With the above arrangement, according to the matrix switching device of the present invention and a method of manufacturing the device, even if a large number of matrix boards serving as circuit boards are stacked, through holes in which connecting pins are respectively inserted can be formed after stacking. Therefore, a problem of misalignment of the boards can be solved, and a high-density arrangement can be obtained. A process technique for a printed wiring board suitable for mass production can be employed to manufacture the above-mentioned matrix board.

In addition, according to the matrix switching device of the present invention and the method of manufacturing the same, practical use of an automatic MDF in a communication network can be effectively realized. At the same time, the matrix switching device can be widely applied to a distribution frame or the like in transmission lines.

BRIEF DESCRIPTION OF THE DRAWINGS

FIG. 6A is a plan view showing an arrangement of X-conductor patterns and the through holes in the matrix board with one set of X- and Y-conductors shown in FIG. 4;

FIG. 6B is a sectional view of the arrangement along the line VIB—VIB in FIG. 6A;

FIG. 6C is a plan view showing an arrangement of Y-conductor patterns and the through holes in the matrix board with one set of X- and Y-conductors shown in FIG. 4;

FIG. 12A is a front view showing a third embodiment of a connecting pin used for the matrix board shown in FIG. 8;

FIG. 12B is a side view of the connecting pin shown in FIG. 12A;

FIG. 12C is a plan view of the connecting pin shown in FIG. 12B when viewed from its distal end;

FIG. 12D is a sectional view of the connecting pin shown in FIG. 12A along the line XIID—XIID thereof;

FIG. 12E is a sectional view of the connecting pin when a contact member is removed from the sectional view in FIG. 12D;

FIG. 12F is a view showing the shape of the contact member shown in FIGS. 12A to 12D;

FIG. 12G is a view showing another shape of the contact member;

FIG. 15A is a plan view showing a sixth embodiment of a connecting pin used for the matrix board shown in FIG. 8;

FIG. 15B is a plan view of the connecting pin shown in FIG. 15A when viewed from its distal end;

FIG. 16A is a front view of a surface-treated spring used for the connecting pin shown in FIG. 15A;

FIG. 16B is a plan view of the spring shown in FIG. 16A;

FIG. 17A is a front view showing another shape of the spring shown in FIG. 15A;

FIG. 17B is a plan view of the spring shown in FIG. 17A;

FIG. 18A is a plan view showing another shape of the spring shown in FIG. 16A;

FIG. 18B is a plan view of the spring shown in FIG. 18A;

FIG. 19A is a front view showing a pin shaft shown in FIG. 15A;

FIG. 19B is a plan view of the pin shaft shown in FIG. 19A when viewed from its distal end; and FIGS. 20A to 20G are partially cutaway perspective views and sectional views of a board for explaining the steps in a manufacturing the matrix board in the matrix switching device of the present invention.

DETAILED DESCRIPTION OF THE PREFERRED EMBODIMENTS

Matrix switching devices according to the present invention and methods of manufacturing the same will be described hereinafter with reference to FIGS. 4 to 20G.

Figure 4:
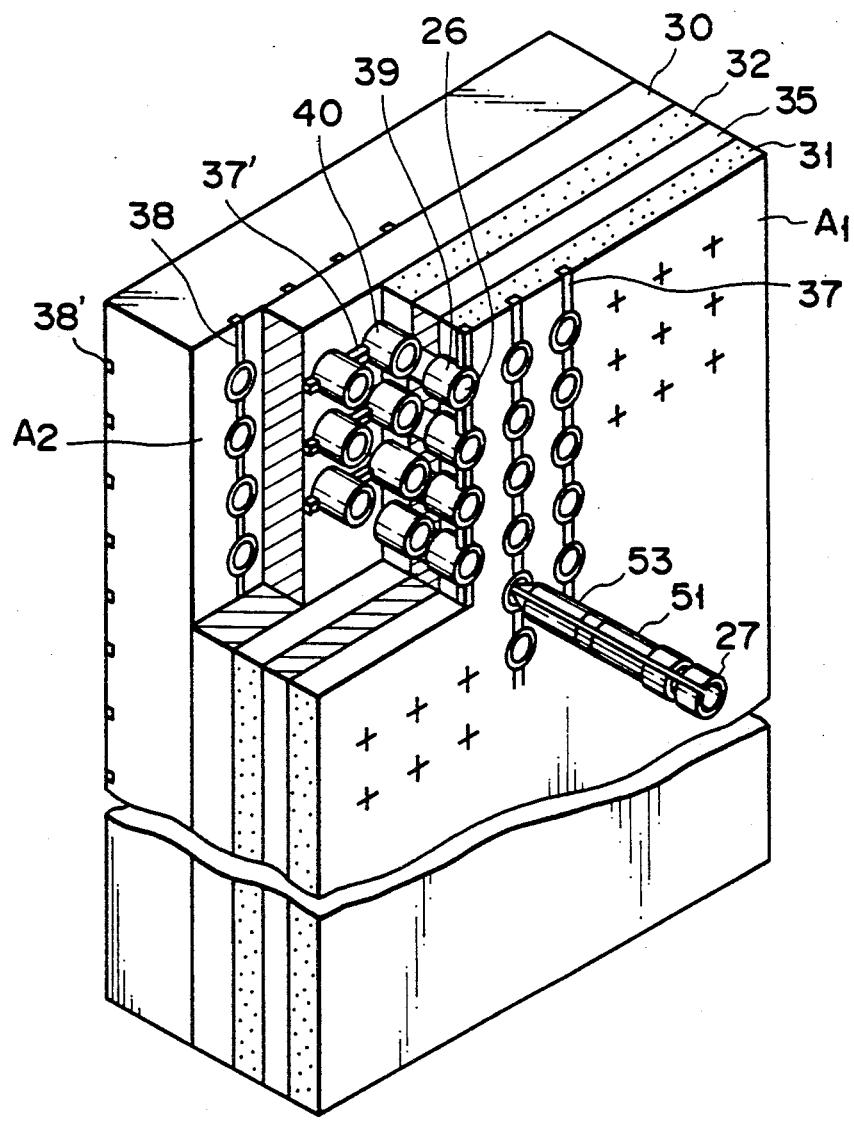
FIG. 4 is a partially cutaway perspective view showing an embodiment of a matrix switching device according to the present invention.

Referring to FIG. 4, reference numeral 26 denotes each through hole; 27, a connecting pin of an elastic material; 30, an insulating board; 31 and 32, printed boards with acceptability to electroless plating; 35, a normal printed board; 37 and 38, $X_1$- and $X_2$-conductor patterns; 37' and 38', $Y_1$- and $Y_2$-conductor patterns; and 39 and 40, isolated through hole plating layers on the through hole 26.

Figure 1:
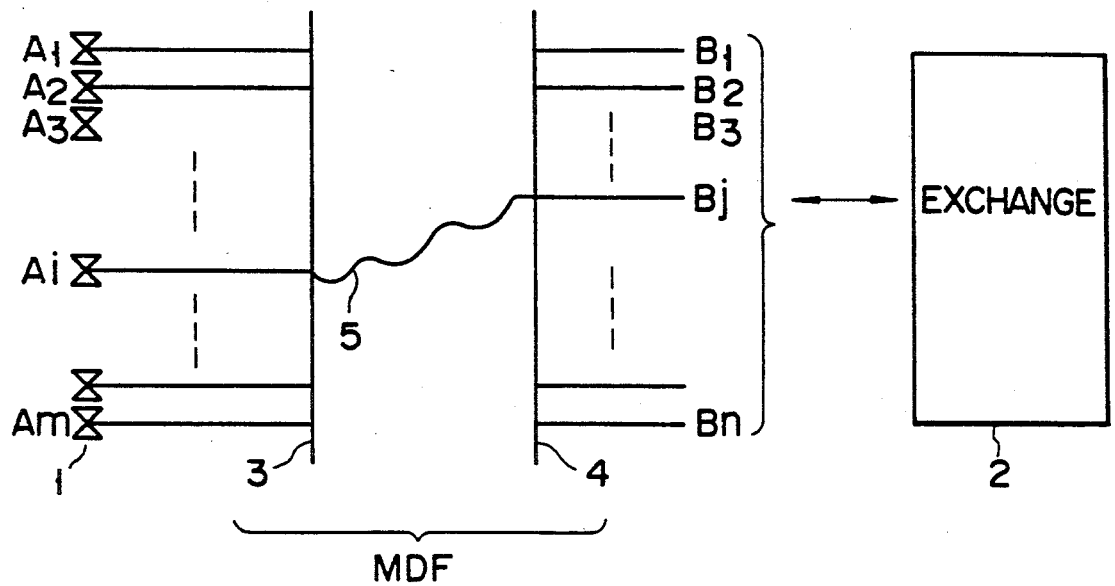
FIG. 1 is a schematic view showing an arrangement of a main distribution frame (MDF) for connecting a telephone set to an exchange in a communication network.
Figure 3:
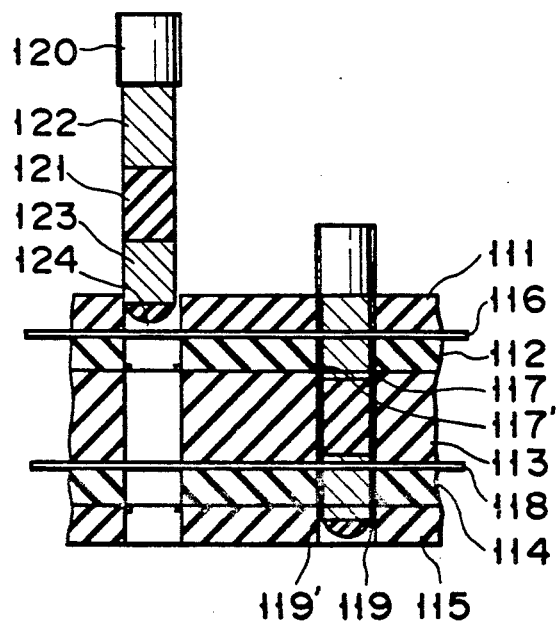
FIG. 3 is a sectional view showing an arrangement of a main part of another conventional pin board matrix.
Figure 2:
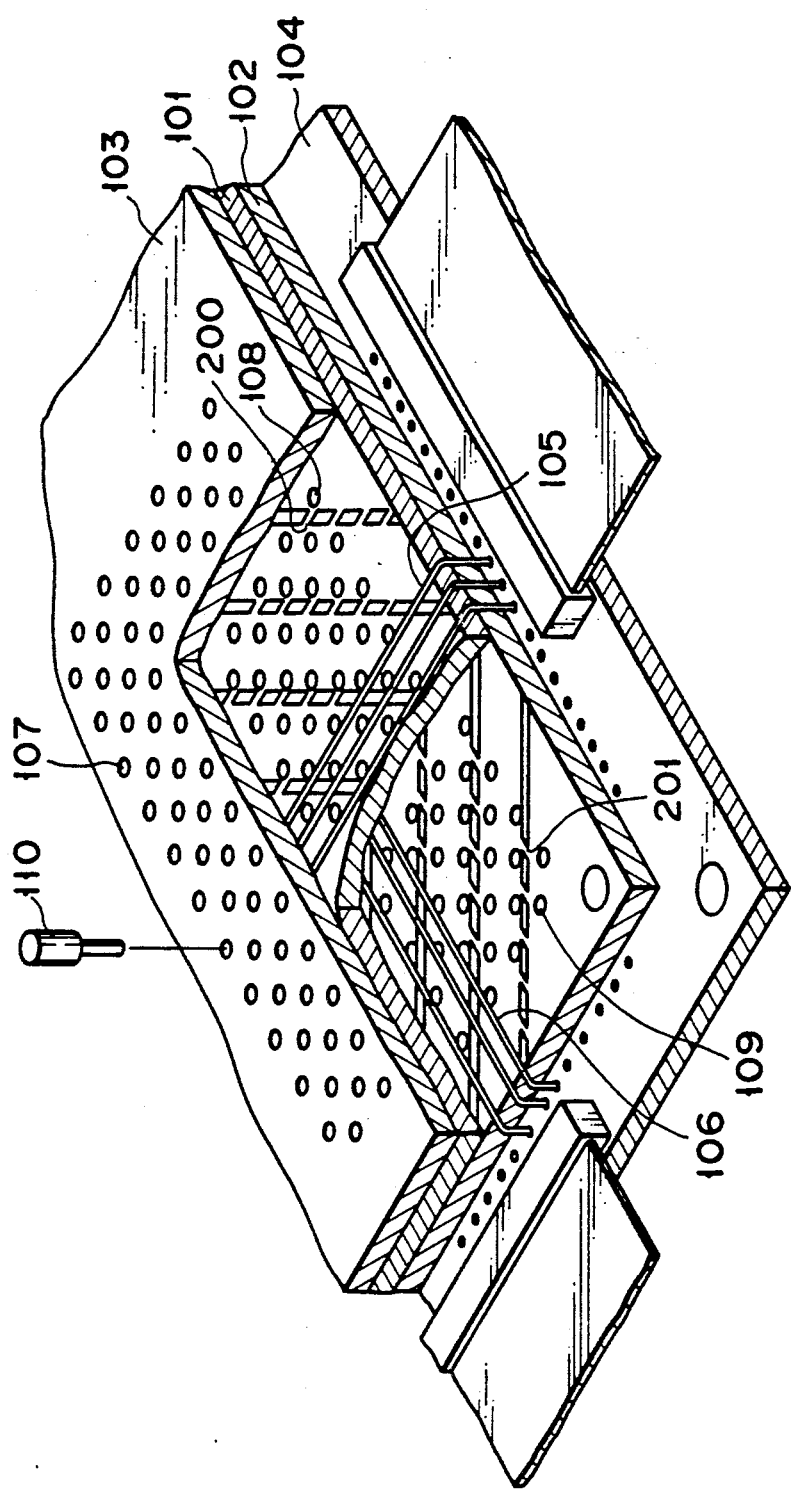
FIG. 2 is a partially cutaway perspective view of a conventional pin board matrix.

FIG. 4 is a partially cutaway perspective view when a main part in FIG. 8 to be described later is viewed as a perspective view. FIG. 4 shows an embodiment wherein two terminal boxes shown in FIG. 3 are stacked.

The printed boards 31 and 32 subjected to electroless plating are printed boards containing a metal such as Pd for allowing electroless plating of an insulating board, and the normal printed board 35 is a printed board not containing a metal such as Pd for allowing electroless plating of an insulating board, and usually made of glass-epoxy resin. As will be described later, the $X_1$- and $X_2$-conductor patterns 37 and 38 of copper films or the like are respectively formed on surfaces $A_1$ and $A_2$, and coupled to the isolated through hole plating layers 39 and 41 (FIG. 8) of the through hole 26. The isolated through hole plating layers 39 and 40 are associated with connection of the $X_1$- and $Y_1$-conductor patterns 37 and 37'.

Although not explicitly shown in FIG. 4, copper films or the like for the $Y_1$- and $Y_2$-conductor 37' and 38' is arranged to couple the isolated through hole plating layers 40 and 42 of the through hole 26 to each other on surfaces $B_1$ and $B_2$ shown in FIG. 8 to be described later. Separated gold plating layers 51 and 53 are formed on the surface of the connecting pin 27 to be described later in detail. Note that, although not shown in FIG. 4, protective layers are formed on the X- and Y-conductor patterns of the uppermost surfaces.

Figure 5:
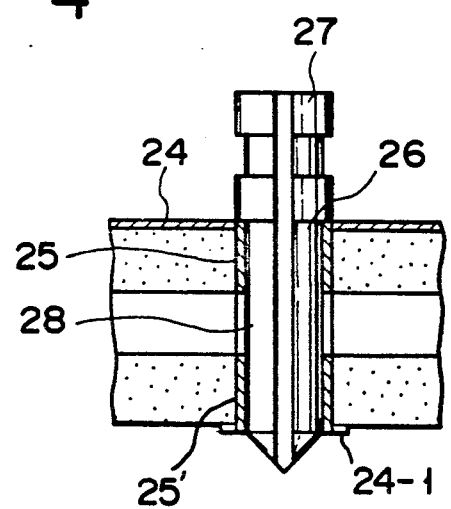
FIG. 5 is an enlarged sectional view showing a state wherein a connecting pin is inserted into a through hole of the matrix board when one set of X- and Y-conductors are arranged shown in FIG. 4 according to an embodiment of the present invention.

FIG. 5 is an enlarged sectional view showing a state wherein the connecting pin is inserted into the through hole of the matrix board shown in FIGS. 6A to 6C.

Reference numeral 24 denotes an X-conductor pattern of, e.g., a copper film; 25, an upper through hole plating layer; 25', a lower through hole plating layer; and 28, a surface-treated portion by, e.g., gold plating. As will be described later, the connecting pin 27 is inserted in the isolated through hole obtained by interrupting conduction of the conductive portions in the intermediate portion of the through hole 26, as shown in FIG. 5. The state wherein the pin 27 is inserted into the isolated through hole of the matrix board shown in FIG. 5 represents the connection principle of the X- and Y-conductor patterns. More specifically, when the connecting pin 27 is inserted into the through hole the upper through hole plating layer 25 connected to the X-conductor pattern 24 of, e.g., a copper film is electrically connected to the lower through hole plating layer 25' connected to the Y-conductor pattern by being in contact with the gold plating layer 28 on the pin surface. As a result, the X-conductor pattern is electrically connected to the Y-conductor pattern. Therefore, when the position on the matrix board of the isolated through holes in which the connecting pin 27 is inserted is properly selected, a pin board matrix for electrically connecting an arbitrary X-conductor pattern to any Y-conductor pattern can be arranged. In the prior art, the boards must be stacked and fixed to each other after through holes are formed in each board, so that misalignment of the holes occurs. Therefore, design in consideration of a sufficient margin for misalignment disables high-density wiring. According to the present invention, a printed wiring board technique for achieving precise process is employed, and hence high-density wiring and mass production can be realized.

FIGS. 6A to 6C are views for explaining a main part of an embodiment of the matrix board according to the present invention. Referring to FIGS. 6A to 6C, reference numerals 21 and 23 denote printed boards subjected to electroless plating; 22, a normal printed board; 24, each X-conductor pattern of, e.g., a copper film; 25, each upper through hole plating layer; 25', each lower through hole plating layer; 24-1, each Y-conductor pattern; and 26, each through hole.

The printed boards 21 and 23 subjected to electroless plating are printed boards containing a metal such as Pd for allowing electroless plating of an insulating board.

As shown in a sectional view in FIG. 6B, the X-conductor patterns 24 shown in FIG. 6A connected to the upper through hole plating layers 25 are arranged on the surface A of the printed board 21. For example, the plurality of X-conductor patterns 24 are arranged in parallel along the X-coordinate direction at equal intervals. The Y-conductor patterns 24-1 shown in FIG. 6C connected to the lower through hole plating layers 25' are arranged on the surface B of the printed board 23. For example, the plurality of Y-conductor patterns 24-1 are arranged in parallel along the Y-coordinate direction at equal intervals.

The upper through hole plating layers 25 of the through holes 26 are surface-treated by, e.g., gold plating, and are connected to the X-conductor patterns 24 formed on the basis of, e.g., a copper film. On the other hand, the lower through hole plating layers 25' are surface-treated by, e.g., gold plating, and are connected to the Y-conductor patterns 24-1. In the above-mentioned through holes 26, the conduction between the through hole plating layers 25 and 25' is interrupted.

Figure 7A:
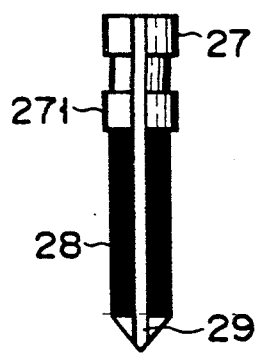
FIG. 7A is front view of the connecting pin shown in FIG. 5.
Figure 7B:
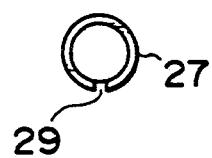
FIG. 7B is a plan view of the connecting pin shown in FIG. 7A when viewed from its top portion.

Note that the conventional through holes are subjected to copper through hole plating on their inner walls from the surface A to surface B without interruption, and hence the surface A is electrically connected to the surface B. On the contrary, in the through holes of the matrix board according to the present invention, gold plating layers 25 and 25' (normally subjected to copper and nickel plating, as underlying plating) are formed on only inner walls corresponding to the printed boards 21 and 23 of each through hole 26. Inner walls corresponding to the printed boards 22 are not subjected to gold plating or the like, and the upper and lower through hole plating layers 25 and 25' are electrically isolated from each other. In the matrix board having such isolated through holes plating, as shown in FIG. 6B, the printed boards 21, 22, and 23 are stacked and fixed to each other, and holes such as drilled holes are formed at crossing points of the X- and Y-conductor pattern. Thereafter, when the inner walls of the holes are subjected to through hole plating, the inner walls corresponding to the boards 21 and 23 containing, e.g., Pd are selectively plated, thus forming the above matrix board. A typical shape of each connecting pin 27 to be inserted in the corresponding through hole 26 is shown in FIGS. 7A and 7B.

Reference numeral 271 denotes an elastic material; 28, a surface-treated portion such as a plating layer; and 29, a slit. The elastic material 271 has, e.g., a hollow cylindrical shape. The slit 29 is formed in a part of the material 271. The surface-treated portion 28 such as a gold-plating layer serves as a conductive portion formed on a surface of the connecting pin. The outer diameter of the connecting pin is slightly larger than the inner diameter of each through hole of the matrix board. Therefore, a pressure acting on the inner wall of the through hole generated when the connecting pin is inserted into the through hole allows an excellent contact state.

Although a rigid member is used for the conventional connecting pin, the connecting pin used for the matrix switching device of the present invention comprises an elastic member. Therefore, when the connecting pin is inserted in the through hole of the matrix board, the contact between the pin and the isolated through hole plating layer connected to the X- or Y-conductor pattern can be achieved without failure. Note that, although an arrangement in which a step is formed between the top portion and the hollow tube of the connecting pin is shown in FIG. 7A, this arrangement is made on an assumption that, e.g., a robot handling operation is performed. However, this arrangement is not indispensable.

Figure 8:
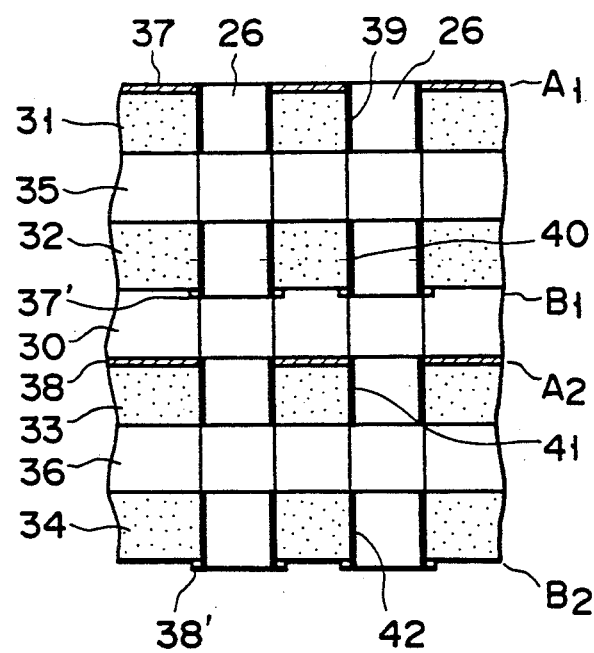
FIG. 8 is a sectional view showing a part of another embodiment of the matrix board according to the matrix switching device of the present invention shown in FIG. 4.

FIG. 8 is a sectional view of a part of another embodiment of the matrix board. FIG. 8 shows an arrangement in which two matrix boards shown in FIG. 6B are stacked via an insulating plate 30. Board 36 is not subjected to electroless plating. The same reference numerals in FIG. 8 denote the same parts as in FIG. 4, and a description thereof will be omitted.

Figure 9A:
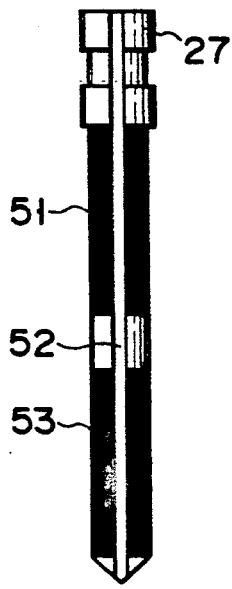
FIG. 9A is a front view showing a first embodiment of a connecting pin used for the matrix board shown in FIG. 8.
Figure 9B:
FIG. 9B is a plan view of the connecting pin shown in FIG. 9A when viewed from its top portion.

A first embodiment of each connecting pin 27 to be inserted in a corresponding through hole 26 (FIG. 4, FIG. 8) of the matrix board is shown in FIGS. 9A and 9B.

Surface-treated portions such as gold plating layers 51 and 53 of the connecting pin 27 are respectively in contact with upper through hole plating layers 39 and 40 of an upper board and lower through hole plating layers 41 and 42 of a lower board. Therefore, each X-conductor pattern 37 can be connected to a corresponding Y-conductor pattern 37', and each X-conductor pattern 38 can be connected to a corresponding Y-conductor pattern 38'. This two-layered matrix board can obtain the same connection capacity as that of the one-layer matrix board by approximately a half area. Note that the same effect can be obtained in a three-layered matrix board.

Figure 10A:
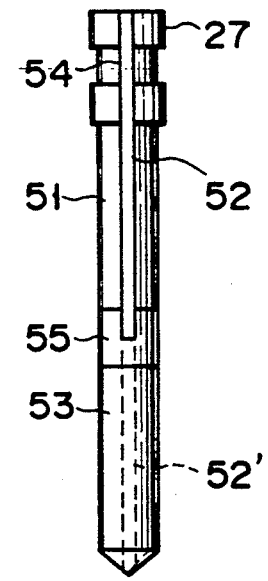
FIG. 10A is a front view showing a second embodiment of a connecting pin used for the matrix board shown in FIG. 8.
Figure 10B:
FIG. 10B is a plan view of the connecting pin shown in FIG. 10A when viewed from its top portion.
Figure 10C:
FIG. 10C is a plan view of the connecting pin shown in FIG. 10A when viewed from its distal end.

A second embodiment of each connecting pin 27 to be inserted in corresponding through hole of the matrix board in FIG. 8 is shown in FIGS. 10A to 10C. As is apparent from FIGS. 10A to 10C, slits 52 and 52' are axially formed with respect to portion 55 not subjected to surface treatment such as gold plating of the connecting pin 27, as their boundary at angular positions spaced apart by 180° along the longitudinal direction of a shaft.

Figure 11A:
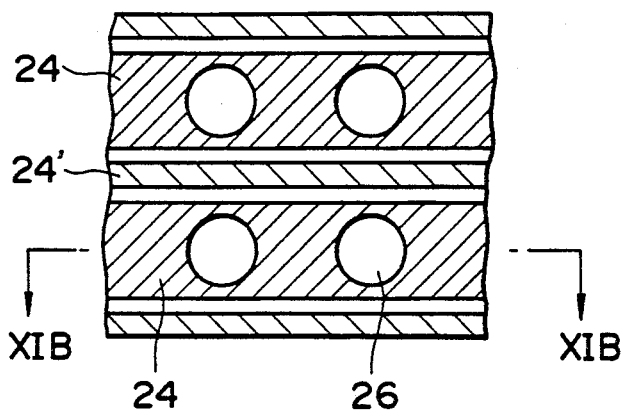
FIG. 11A is a plan view showing another arrangement of the X-conductor patterns and the through holes in the matrix board shown in FIG. 6.
Figure 11B:
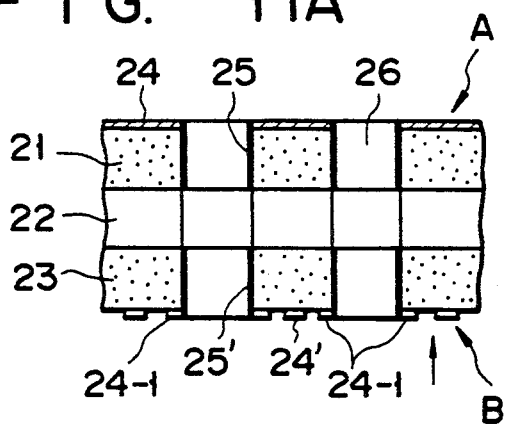
FIG. 11B is a sectional view of the arrangement along the line XIB—XIB in FIG. 11A.
Figure 11C:
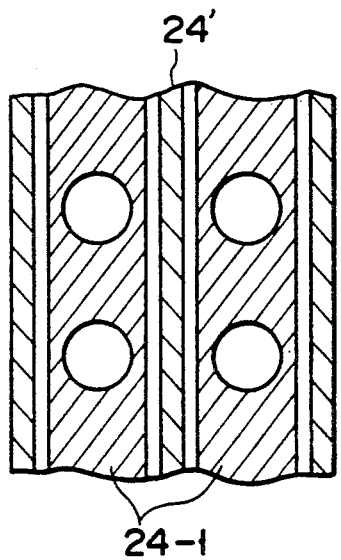
FIG. 11C is a plan view showing another arrangement of Y-conductor patterns and the through holes in the matrix board shown in FIG. 6 when viewed from a direction of an arrow in FIG. 11B.

FIGS. 11A to 11C are views for explaining main parts of still another embodiment of the matrix board according to the present invention. An arrangement in FIGS. 11A to 11C is the same as that in FIGS. 6A to 6C except that a shield pattern 24' is formed. The same reference numerals in FIGS. 11A to 11C denote the same parts as in FIGS. 6A to 6C, and a description thereof will be omitted.

As shown in FIG. 11A, the shield pattern 24' is arranged between adjacent X-conductor patterns 24. Similarly, as shown in FIGS. 11B and 11C, the shield pattern 24' is arranged between adjacent Y-conductor patterns 24-1. These shield patterns 24' are arranged to improve crosstalk characteristics of a signal supplied to the X- and Y-conductors.

The shield pattern is not limited to one, and a plurality of shield patterns may be arranged. The layer-like shield pattern may be arranged in the intermediate portion between the X- and Y-conductors. In addition, in order to form a selective conductive portion on the through hole, a method except plating may be employed.

FIGS. 12A to 12G show a third embodiment of a connecting pin to be inserted in a through hole of the matrix board shown in FIG. 8.

Figures 13A, 13B, 13D, 13E:
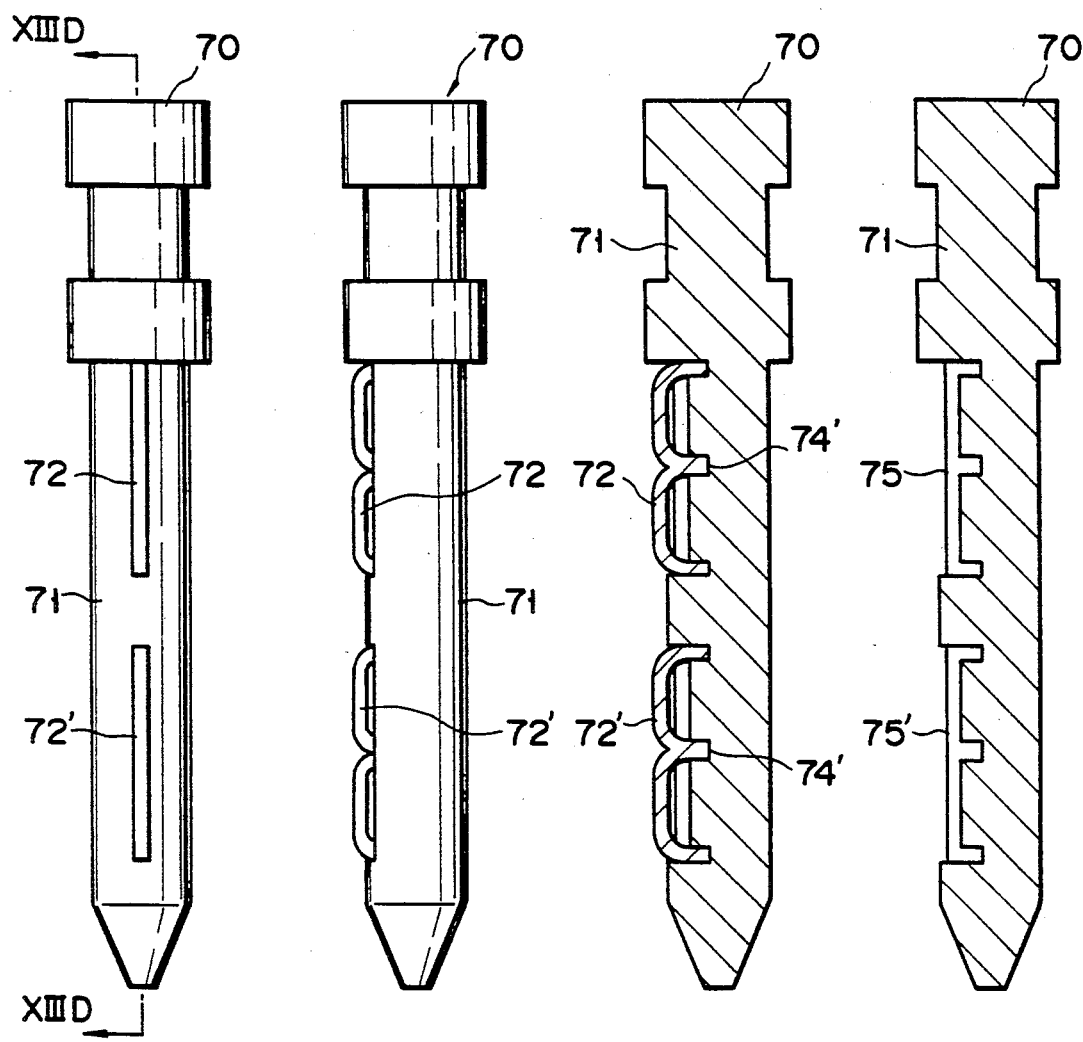
FIG. 13A is a plan view showing a fourth embodiment of a connecting pin used for the matrix board shown in FIG. 8.
FIG. 13B is a side view of the connecting pin shown in FIG. 13A.
FIG. 13D is a sectional view of the connecting pin shown in FIG. 13A along the line XIIID—XIIID thereof.
FIG. 13E is a sectional view of the connecting pin when a contact member is removed from the sectional view in FIG. 13D.
Figure 13C:
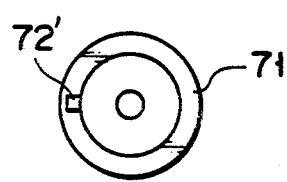
FIG. 13C is a plan view of the connecting pin shown in FIG. 13B when viewed from its distal end.
Figure 13F:
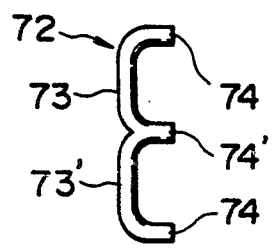
FIG. 13F is a view showing the shape of the contact member shown in FIGS. 13A to 13D.
Figure 14A:
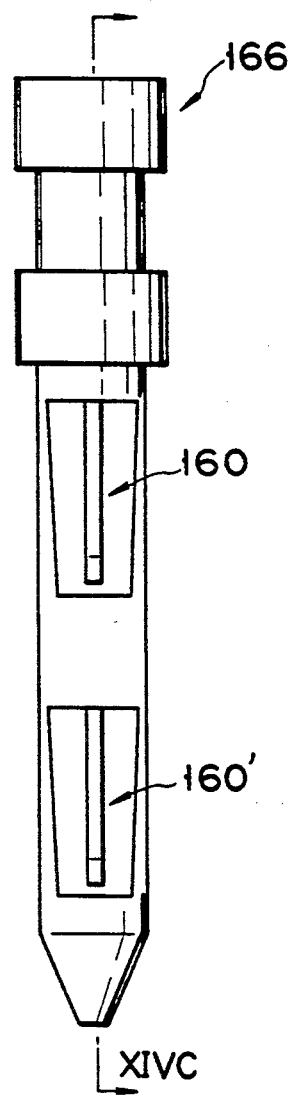
FIG. 14A is a plan view showing a fifth embodiment of a connecting pin used for the matrix board shown in FIG. 8.
Figure 14B:
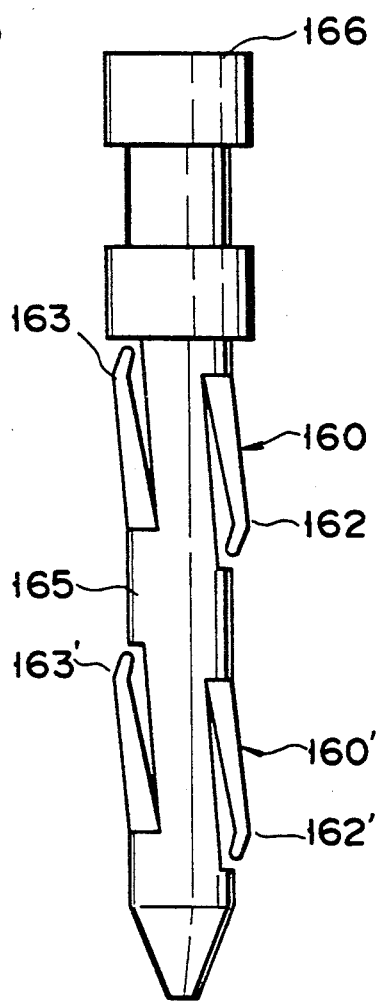
FIG. 14B is a side view of the connecting pin shown in FIG. 14A.
Figure 14D:
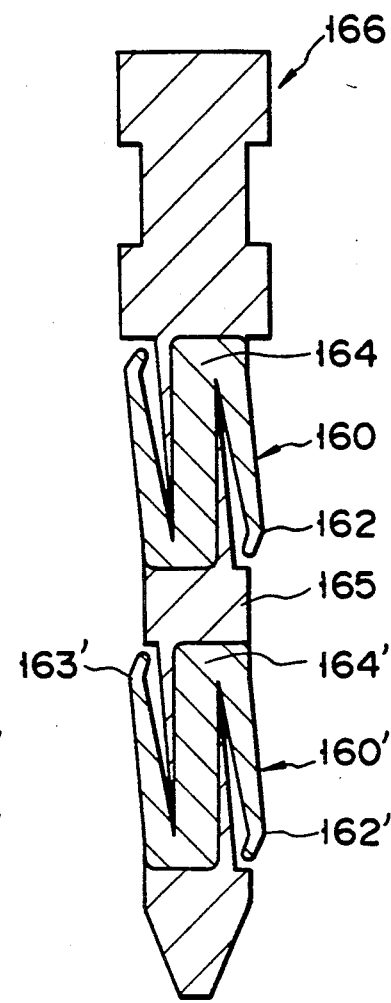
FIG. 14D is a sectional view of the connecting pin shown in FIG. 14A along the line XIVC—XIVC thereof.
Figure 14C:
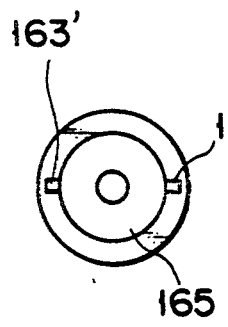
FIG. 14C is a plan view of the connecting pin shown in FIG. 14B when viewed from its distal end.
Figure 14E:
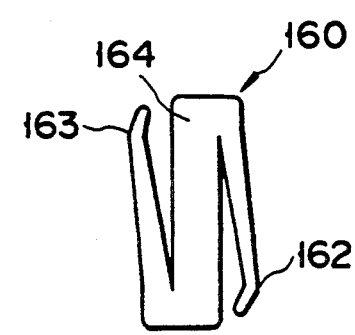
FIG. 14E is a view showing the shape of the contact member shown in FIGS. 14A to 14D.
Figure 14F:
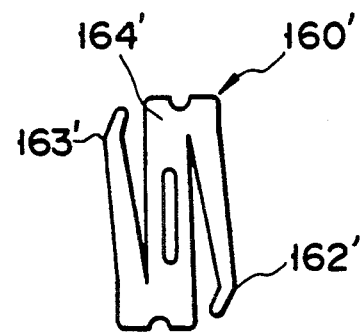
FIG. 14F is a view showing another shape of the contact member.

Referring to FIGS. 12A to 12G, reference numeral 60 denotes each pin; 61, each pin main body (shaft); 62, 62', and 62'', contact members (FIGS. 12A, 12B, 12C, 12D, 12F, and 12G); 63, a spring having a contact to be in contact with two isolated through hole plating layers which are respectively conductive with X- and Y-conductor patterns (FIG. 12F); 63', a spring having a contact to be in contact with an isolated through hole plating layer which is conductive with the X-conductor pattern (FIG. 12G); 63", a spring having a contact to be in contact with an isolated through hole plating layer which is conductive with the Y-conductor pattern (FIG. 12G); 64 and 64', legs of the contact members (FIGS. 12F and 12G); and 65 and 65', narrow grooves formed in a shaft (FIG. 12E). FIGS. 13A to 13F are views for explaining a fourth embodiment of a connecting pin used in FIG. 8. Reference numeral 70 denotes each pin; 71, each shaft; 72 and 72', contact members (FIGS. 13A, 13B, 13C, 13D and 13F); 73, a spring having a contact to be in contact with isolated through hole plating layers which are conductive with the X-conductor pattern (FIG. 13F); 73', a spring having a contact to be in contact with isolated through hole plated layer which are conductive with the Y-conductor pattern (FIG. 13F); 74 and 74', legs of the contact members (FIG. 13F); and 75 and 75', narrow grooves formed in the shaft (FIG. 13E).

An arrangement of the connecting pin for the matrix board shown in FIGS. 12A to 12E, and FIGS. 13A to 13F will be described hereinafter. The contact members 62 (FIG. 12A) and 72 (FIG. 13A) are subjected to surface treatment such as gold plating having high corrosion resistance. Thereafter, the legs 64 (FIG. 12F), 74, and 74' (FIG. 13F) of the contact members 62 and 72 are pressed in and fixed to the narrow grooves 65 (FIG. 12E) and 75 (FIG. 13E) respectively formed in the shafts 61 and 71 as molded bodies. The contact members 62 (FIGS. 12A, 12B, 12C, and 12D) and 72 (FIGS. 13A, 13B, 13C, and 13D) are processed in the same manner. Note that after the contact members are pressed in the grooves, the maximum diameter of the pin measured from an upper surface of the contact member is set to be a sufficiently larger value than the diameter of the thorough hole.

Assume that the pin 60 shown in FIG. 12A is inserted into the through hole 26 of the matrix board shown in FIG. 8. For example, when an effective diameter of the through hole 26 on which the through hole plating layer 39 is formed is smaller than that of other portions due to a wavelike pattern of the through hole 26 and local projections in the isolated through hole plating layer 39 electrically connected to the $X_1$-conductor pattern 37, a portion corresponding to the isolated through hole plating layer 39 of the contact member 62 is considerably deformed toward the center of the connecting pin. However, since the spring 63 (FIG. 12F) has a substantially U shape and fixed by its legs, a portion of the spring 63 corresponding to the isolated through hole plating layer 40 electrically connected to the $Y_1$-conductor pattern 37' is deformed toward the opposite side with respect to the center of the pin. Therefore, the spring 63 can be reliably brought into contact with both the isolated through hole plating layers 39 and 40 regardless of the wavelike pattern of the through hole 26 and the local projections on the inner wall, thus assuring connection reliability. In addition, the contact member 62' can reliably connect an isolated through hole plating layer 41 electrically connected to an $X_2$-conductor pattern 38 and an isolated through hole plating layer 42 electrically connected to a conductor pattern 38' without an influence of the contact member 62, as a matter of course. Note that when the contact member 62" (FIG. 12G) is used, the same effect as described above can be obtained.

Assume that the pin 70 shown in FIG. 13A is inserted into the through hole 26 of the matrix board shown in FIG. 8. When an effective diameter in the isolated through hole 26 on which the through hole plating layer 39 is formed is smaller than that of other portions due to the wavelike pattern of the through hole 26 and local projections of the isolated through hole plating layer 39 electrically connected to the $X_1$-conductor pattern 37, the contact member 72 is deformed toward the center of the connecting pin. However, since the central leg 74' of the contact member is fixed to the shaft 71, even if the spring 73 is deformed, the deformation does not adversely affect the spring 73'. In other words, the springs 73 and 73' can be respectively brought into contact with both the isolated through hole plating layers 39 and 40 without failure regardless of the wavelike pattern of the through hole 26 and the local projections on the inner wall.

As described above, when the connecting pins shown in FIGS. 12A to 12G and FIGS. 13A to 13F are used, excellent connection reliability of the pin board matrix can be realized.

In addition, the contact members can be manufactured by process techniques such as pressing or etching suitable for mass production. The shaft can be formed by a molding technique, and the contact members can be fixed utilizing an automatic machine, a jig, or the like. Therefore, the connecting pin of the present invention is suitable for mass production.

Note that since the contact members 62 and 62' (FIGS. 12A to 12D), and the contact members 72 and 72' (FIGS. 13A to 13D) are electrically insulated, the conductor patterns in the $X_1$ and $X_2$ layers ($Y_1$ and $Y_2$ layers) are not short-circuited.

FIGS. 14A to 14F are views for explaining a fifth embodiment of a pin used for a pin board matrix shown in FIG. 8. Reference numerals 160 and 160' denote contact members; 162 and 162', springs each having a contact to be in contact with the isolated through hole plating layer which is electrically connected to the Y-conductor pattern; 163 and 163', springs each having a contact to be in contact with the isolated through hole plating layer electrically connected to the X-conductor pattern; 164 and 164', coupling portions for coupling the above-mentioned contact portions to each other; 165, a shaft formed by a molding material; and 166, an entire pin.

An arrangement of the connecting pin shown in FIGS. 14A to 14F will be described hereinafter. The contact member 160 is subjected to a surface treatment such as Au plating having high corrosion resistance. Thereafter, the resultant contact member 160 is located so that the coupling portion 164 is fixed to a predetermined position of the shaft 165 as a molded body. The contact member 160' is processed in the same manner. Then, the shaft 165 is formed into a pin 166 by insert molding using a molding material.

When the pin 166 shown in FIGS. 14A to 14D is inserted into the through hole 26 of the matrix board shown in FIG. 8, the springs 162', 163', 162, and 163 are inserted into the through hole 26 in the order named. Finally, the contact of the spring 162' is brought into contact with the isolated through hole plating layer 42, and the contact of the spring 163' is brought into contact with the isolated through hole plating layer 41. Therefore, the conductor pattern 38 of the $X_2$ layer is connected to the conductor pattern 38' of the $Y_2$ layer through the contact member 160'. Similarly, the conductor pattern 37 of the $X_1$ layer is connected to the conductor pattern 37' of the $Y_1$ layer through the contact member 160. At this time, since the springs 162, 162', 163, and 163' are independently formed, each spring is brought into contact with the corresponding through hole plating layer without failure. In addition, since the pin 166 is in contact with the through hole 26 via the springs 162, 162', 163, and 163', even if the surfaces of the isolated through hole plating layers are uneven, the pin 166 moves so that the contact forces of the springs are equal to each other. Therefore, the contact state is uniformed and the connection reliability can be improved.

In addition, the contact members can be formed by process techniques such as pressing or etching suitable for mass production, and fixing of the contact members to the shaft and formation of the shaft can be performed together by an insert molding technique. Therefore, the connecting pin of the present invention is suitable for mass production.

Note that since the contact members 160 and 160' are electrically insulated from each other, the conductor patterns in the $X_1$ and $X_2$ layers 37 and 38 ($Y_1$ layer 37' and $Y_2$ layer 38') are not short-circuited.

FIGS. 15A and 15B are views for explaining a sixth embodiment of a connecting pin used for the matrix board shown in FIG. 8. Reference numeral 81 denotes a pin obtained by caulking a spring with a contact; 82 and 83, springs subjected to a surface treatment such as gold plating; 84, a slit of the spring 82; 86 and 87, projecting portions formed on the springs 82 and 83; and 88, an insulator shaft on which the spring with a contact is caulked. FIGS. 16A and 16B are front and plan views of the springs 82 and 83 caulked on the connecting pin 81 shown in FIG. 15A. Reference numeral 82 denotes a spring subjected to a surface treatment such as gold plating, as described above; 84, a slit for a flexing margin upon spring deformation; 86, projecting portions formed on the spring; and 89, tapered both end portions of the projecting portions 86. In FIG. 16A showing an enlarged front view of the spring 82 shown in FIG. 15A, the maximum outer diameter of the spring 82 including the projecting portions 86 is slightly larger than the inner diameter of the through hole 26 of the matrix board shown in FIG. 8. When the pin 81 is inserted into the through hole 26, the outer surface of the spring 82 is brought into contact with the inner wall of the through hole 26 at a proper contact pressure upon flexing of the spring 82. In particular, since the projecting portions 86 are formed on the spring 82, when the inner wall of the through hole 26 is brought into contact with the outer surface of the spring 82, the contact pressure is concentrated on the projecting portions 86, thus obtaining an excellent contact state. In addition, since tapered portions 89 are formed at the ends of the projecting portions 86 of the spring 82, the pin can be smoothly inserted/removed. FIG. 16B is a plan view of the pin viewed from its distal end when the spring 82 shown in FIG. 16A is used for the connecting pin 81 shown in FIG. 15A.

FIGS. 17A and 18A show another arrangement of the spring caulked on the connecting pin 81 shown in FIG. 15A. A spring 82' shown in FIG. 17A can be obtained by modifying the shape of the slit 84 for a flexing margin upon deformation of the spring to be a convex or concave shape. When the recessed and projecting portions of the slit 84' are meshed with each other, the spring 82' is caulked on the connecting pin 88 with higher reliability. FIG. 17B is a plan view of the pin viewed from its distal end when the spring 82' shown in FIG. 17A is used for the connecting pin 81 shown in FIG. 15A. A spring 82" shown in FIG. 18A can be obtained by forming notches in the end portions of the spring 82 shown in FIG. 16A, and inwardly bending remaining portions of the notches to form guide portions 90. Therefore, the pin can be further smoothly inserted/removed. FIG. 18B is a plan view of the pin viewed from its distal end when the spring 82" shown in FIG. 18A is used for the connecting pin 81 shown in FIG. 15. Note that, as other arrangements besides the above-mentioned arrangements, a spring obtained by combining a convex or concave slit shape 84' shown in FIG. 17A with a spring end shape 90 shown in FIG. 18A can be exemplified in place of the spring 82 shown in FIG. 16A. However, since drawings, functions, effects, and the like of the spring are apparent from the above description, a description thereof will be omitted. In the springs 82, 82', and 82" respectively shown in FIGS. 16A, 17A, and 18A, the widths of the projecting portions 86, 86', and 86" are slightly shorter than those of the springs. However, a plurality of projecting portions each having a short width (e.g., a circle, ellipse, and rectangular circle) can be formed on the position of the projecting portion, and no projecting portion can be formed as an alternative.

FIG. 19A is a front view of the pin shaft 88 shown in FIG. 15A, and FIG. 19B is a plan view of the pin shaft 88 viewed from its distal end. The shaft 88 is formed by an insulator such as a molded product of plastic or a metal having an insulating coating thereon. Reference numeral 881 denotes a portion on which the spring portions 82, 82', and 82" respectively shown in FIGS. 16A, 17A, and 18A are caulked; and 882, 883, and 884, portions for locking the caulked spring. The diameters of the portions 882, 883, and 884 are set to be smaller than the inner diameter of the spring when the spring is flexed in the through hole 26 so that the caulked springs are not removed from the portion 881. Therefore, it is assured that the springs 82, 83, and the like are held on the pin 81 and are in contact with the inner wall of the through hole 26 at a proper contact pressure.

A method of manufacturing a matrix board will be described below with reference to FIGS. 20A to 20G. More specifically, as shown in FIG. 20A, X inner-layer conductor patterns 92 are formed on one surface of a printed board 91 subjected to electroless plating containing, e.g., Pd. In addition, Y inner-layer conductor patterns 93 are formed on the other surface of a printed board 91' subjected to electroless plating, as shown in FIG. 20B. Thereafter, as shown in FIG. 20C, two sets of boards are formed as follows. Each normal printed board 94 not subjected to electroless plating is sandwiched between the printed board 91 or 91' on which X or Y inner-layer conductive patterns 92 or 93 are formed and a corresponding printed board 91" on which a copper film 96 is formed on its surface layer. Then, these two sets of boards are stacked via an insulating board 95. The stacked board is heated and pressurized to form a multi-layered board. Thereafter, as shown in FIG. 20D, the copper films 96 are etched to form X and Y surface-layer conductor patterns 97 and 98. Thereafter, as shown in a perspective view in FIG. 20E and a sectional view in FIG. 20F, through holes 100 are formed at crossing points of the X- and Y-conductor patterns 97 and 93, and 92 and 98, respectively. Thereafter, as shown in FIG. 20G, in the inner wall of each through hole 100, noble metal contact layers 99 are selectively formed on the sectional portions of the printed boards 91, 91', and 91" subjected to electroless plating, and the sectional portions of the X- and Y-conductor patterns by electroless plating, or formed on the electroless plated layer by electrolytic plating through the X- and Y-conductor patterns, thus manufacturing a matrix board.

What is claimed is:

1. A matrix switching device comprising:
   a matrix board including X- and Y-conductor patterns respectively corresponding to upper and lower surfaces of a printed board and arranged in a matrix form, cylindrical contacts connected to said X- and Y-conductor patterns at crossing points thereof, and intermediate isolation portions for interrupting conduction between said cylindrical contacts, said cylindrical contacts and said intermediate isolation portions defining through holes formed in said matrix board; and
   a connecting pin comprising a pin main body and conductive contact members having spring portions brought into contact with the cylindrical contacts formed in each of the through holes of said matrix board, said spring portions each having at least two legs, said conductive contact members being fixed to said pin main body by said at least two legs.

2. A matrix switching device according to claim 1, wherein said spring portions of each of said contact members comprises three legs, and said conductive contact members are fixed to said pin main body by said three legs.

3. A method of manufacturing a matrix switching device, comprising the step of:
   sequentially stacking a printed board subjected to electroless plating and having a metal film formed on its upper surface to form Y-conductor patterns, a printed board not subjected to electroless plating, a printed board subjected to electroless plating and having X-conductor patterns on its surface in advance, a printed board not subjected to electroless plating, a printed board subjected to electroless plating and having Y-conductor patterns on its surface in advance, a printed board not subjected to electroless plating, and a printed board subjected to electroless plating and having a metal film on its lower surface to form X-conductor patterns to form a multi-layered board;
   etching said metal film, forming Y- and X-conductor patterns on upper and lower surfaces of said multi-layered board to respectively correspond to said X- and Y-conductor patterns;
   forming through holes in said multi-layered board at crossing points of said X- and Y-conductor patterns;
   forming insulated and isolated portions on intermediate inner wall portions of said through holes in units of layers, forming conductive portions, and respectively connecting said conductive portions to said X- and Y-conductor portions; and
   preparing a connecting pin having surface-treated conductive portions brought into contact with said conductive portions formed in said inner wall of said one of said through holes so that said X- and Y-conductor patterns are electrically connected to each other when said connecting pin is inserted into said one of said through holes formed in said multi-layered board.

4. A method of manufacturing a matrix switching device, comprising the steps of forming a basic matrix board comprising the steps of:
   forming X-conductor patterns on a surface of one printed board of two printed boards subjected to electroless plating, and arranging Y-conductor patterns on a surface of the other printed board in a matrix form with said X-conductor patterns;
   sandwiching a printed board not subjected to electroless plating between said two printed boards, thereby forming stacked printed boards;
   forming a multi-layered printed board by heating and pressing together said stacked printed boards;
   forming a through hole in said two printed boards and in said printed board sandwiched therebetween at crossing points of said X- and Y-conductor patterns;
   forming contact underlying layers, by electroless plating, on only exposed sections of said printed boards subjected to electroless plating among said two printed boards on an inner wall of said through hole;
   forming contacts on said inner wall of said through hole by performing noble metal plating on the basis of said contact underlying layers; and
   preparing a connecting pin having a surface-treated conductive portion brought into contact with said contacts so that said X- and Y- conductor patterns are electrically connected to each other when said connecting pin is inserted into said through hole formed in said stacked printed boards.

5. A method of manufacturing a matrix switching device, comprising the steps of:
   forming a first multi-layered matrix board by:
      stacking sequentially a printed board (91") subjected to electroless plating and having a metal film (98) formed on a lower surface thereof, a printed board (94) not subjected to electroless printing, and a printed board (91) subjected to electroless plating and having X-conductor patterns (92) on an upper surface thereof in advance;
   a further printed board (95) not subjected to electroless plating;
   forming a second multi-layered matrix board by:
      stacking sequentially a printed board (91') subjected to electroless plating and having Y-conductor patterns (93) on a lower surface thereof in advance, a printed board (94) not subjected to electroless printing, and a printed board (91") subjected to electroless plating and having a metal film (96) formed on an upper surface thereof;
   forming respective first and second multi-layered matrix boards by heating and pressing together said respective stacked printed boards;
   stacking said first and second matrix boards on one another with said further printed board interposed therebetween to form a multi-layered composite structure;
   etching said metal film (96, 96) for forming Y- and X-conductor patterns (98, 97) on lower and upper surfaces of said composite structure to respectively correspond to said first mentioned X- and Y-conductor patterns on said printed boards;

forming through holes (100) in said boards of said multi-layered composite structure at crossing points of said X- and Y-conductor patterns;

forming contact underlying layers, by electroless plating, on only exposed sections of said printed boards subjected to electroless plating among said stacked printed boards on inner walls of said through holes formed in said multi-layered composite structure;

forming contacts on said inner walls of said through holes by performing noble metal plating on the basis of said contact underlying layers; and preparing a connecting pin having two surface-treated conductive portions brought into contact with said contacts so that said X- and Y-conductor patterns are electrically connected to each other when said connecting pin is inserted into said through holes formed in said multi-layered composite structure.

* * * * *